United States Patent [19]
Berthold et al.

[11] Patent Number: 5,997,640
[45] Date of Patent: Dec. 7, 1999

[54] DEVICE AND METHOD FOR LIQUEFYING AND CRYSTALLIZING SUBSTANCES

[75] Inventors: Thomas Berthold; Hermann Boedinger, both of Munich, Germany

[73] Assignee: Siemens Aktiengesellschaft, Munich, Germany

[21] Appl. No.: 09/132,545

[22] Filed: Aug. 11, 1998

[51] Int. Cl.[6] .................................................. C30B 35/00
[52] U.S. Cl. .................. 117/200; 117/204; 117/900; 65/33.1
[58] Field of Search ................... 117/200, 204, 117/206, 900; 65/33.1; 23/295 R; 127/15

[56] References Cited

U.S. PATENT DOCUMENTS

| 5,308,446 | 5/1994 | Bihuniak et al. | 117/13 |
| 5,372,090 | 12/1994 | Wegmeth et al. | 117/213 |

FOREIGN PATENT DOCUMENTS

| 9-175885 | 7/1997 | Japan . | |

OTHER PUBLICATIONS

Patent Abstracts of Japan dated Oct. 13, 1982, vol. 6, No. 202.

Article entitled: "Growth of Pure and Ta–Substituted $Ba_3(VO_4)_2$ Single Crystals", Kramer et al., *Journal of Crystal Growth*, vol. 89 (1988), pp. 155–159.

Article entitled: "Scintillator Material Growth", Nestor, *Mat. Res. Soc. Symp. Proc.*, vol. 16 (1983), pp. 77–85.

*Primary Examiner*—Felisa Hiteshew
*Attorney, Agent, or Firm*—Hill & Simpson

[57] ABSTRACT

A multi-shelled melt container is disclosed for liquefying and crystallizing substances which comprises at least an inner shell and a bearing shell. While the inner shell—which has a thin wall in comparison to the wall of the bearing shell—consists of an inert material with respect to the melt, the bearing shell serves exclusively to fixate and support the inner shell and is correspondingly constructed in a mechanically stable fashion. The device can also comprise means to pump the melt over into a collection vessel.

14 Claims, 2 Drawing Sheets

DEVICE AND METHOD FOR LIQUEFYING AND CRYSTALLIZING SUBSTANCES

FIELD OF THE INVENTION

The present invention relates generally to melt containers for melting and liquefying crystallizing substances. More specifically, the present invention relates to multi-shelled melt containers coupled to collection vessels.

BACKGROUND OF THE INVENTION

In various technologies, monocrystals of the most diverse substances are utilized, such as doped alkali halogenides of NaI, CsI, NaCl, KCI, KI, for example, as scintillator materials for detecting high-energy radiation, as semiconductors for microelectronics such as silicon or gallium arsenide, or aluminum oxide (sapphire) likewise in semiconductor technology as substrate material. Crystals with greater and greater diameters are increasingly required by the semiconductor industry. An article by U.H. Nestor, Mat. Res. Soc. Symp. Proc. Vol. 16 (1983), p. 77 to 85 teaches the production of sodium iodide crystals with a diameter of 75 cm and a weight up to half a ton, for example.

In most of the currently common growing methods, vessels are required in order to receive the melt of the substance. In the Bridgman-Stockbarger method, the vessels are exactly as large as the desired diameter of the crystal; in the Czochralski method, the vessels are slightly larger than the desired diameter of the crystal. These vessels must consist of a material that is mechanically stable and, in addition, inert relative to the melt. For growing the cited alkali halogenide crystals, vessels of silicate glass, graphite or precious metal are usually used. While platinum demonstrates very favorable properties, platinum requires enormous investment costs due to the required crucible size. A suitable and more favorable material with respect to the material costs is iridium, whose treatment is however more expensive and requires a higher initial outlay. Glass is a cheap material, but far more brittle than most metals. Melting vessels of glass are thus limited in size to 60 cm for reasons of stability, from which only crystals up to 40 cm can be pulled according to the Czochralski method.

Stable melting vessels are necessary for the growing of halogenide crystals, since crucible walls of silicate glass are already corroded by the melt given the presence of slight traces of water or hydroxide molecules. As a result, the melt strongly adheres to the crucible following solidification. The enormous tensile stresses arising in cooling due to the thermal contraction of the melt can also lead to the destruction of the crucible. In the known method for producing halogenide crystals, this problem is solved in that the hydroxide is bonded by reaction with various gaseous substances, preferably through replacement with hydrogen halide compounds, and thus removed from the crystal growing vessel (see for example JP-A 63 107 886). A disadvantage of this method is that it requires a high technical outlay, since the vessel must be evacuated and the reaction gasses must be cautiously added in a metered fashion.

Therefore, there is a need for a device for liquefying and crystallizing substances with which monocrystals with particularly large diameters can be created in a cost-effective fashion in a simple method.

SUMMARY OF THE INVENTION

One concept of the present invention is a multi-shelled melt container in which the properties required for a melt container are distributed among various shells. The inventive device thus includes at least two shells, namely an inner shell which is inert with respect to the melt, and a bearing shell which fulfills the requirements with reference to the mechanical stability of the melt container. The inner shell is therein arranged positively inside the bearing shell and has a relatively thin wall compared to the bearing shell.

An ideal melt container is obtained in simple fashion through the division of the functionalities of the melt container into a plurality of shells and thus into various materials. Since the chemically inert inner shell needs to satisfy only slight requirements with respect to the mechanical stability, a greater selection of materials—particularly of cost-effective materials—is suitable therefor. It is also relevant here that only a relatively thin wall is still necessary for the inner shell, which results in a clear cost savings particularly given inner shells of expensive materials such as precious metal, for example.

A still larger selection of materials is available for the bearing shell. Since this shell does not stand in contact with the melt, it can consist of a non-inert, cost-effective material such as chamotte, aluminum oxide, stoneware, steel and the like. To obtain the required mechanical stability, the bearing shell can be constructed in an arbitrarily thick fashion and need not be optimized at a minimal thickness.

The inventive device is suitable for melting and crystallizing all substances for which a material can be found for the inner shell which is inert relative to the melt. With the inventive device it is possible to increase in simple fashion the size of the melt container and thus the size of the monocrystals which can be produced therein relative to previously known devices. Since in general, with the production of larger monocrystals in the given device, the object is additional simplifications of the method as well as cost savings, any method for producing monocrystals from the melt is also improved with the utilization of the inventive device.

The inventive device can of course also be utilized for the production of multicrystals that are intergrown in defined or undefined fashion or of polycrystalline solidifying bodies.

In a further development of the invention the inner shell and bearing shell are mutually connected in detachable fashion. It is possible to combine the bearing shell with various inner shells in this way, or respectively, to replace a defective or damaged inner shell. Since the inner shell is positively arranged within the bearing shell, a costly securing of the inner shell at or in the bearing shell is unnecessary. In a further development of the invention, an intermediate layer is arranged between inner shell and bearing shell. The intermediate layer serves as insulation and balancing layer for pressures acting punctually. The intermediate layer may consist of ceramic tile, for example.

In a development of the invention the inner shell is constructed of foil with which the interior space of the bearing shell is lined. It is preferably a not too brittle foil, but rather a soft and ductile one which is constructed of a metal, alloys or graphite, for example. In the inventive arrangement, the inner shell merely has the function of preventing a leakage or a contamination of the melt. The thickness of the material can thus be kept so low that merely an adequate stability in transport and assembly of the shell is guaranteed. For platinum, this thickness lies between 0.05 and 0.5 mm, for example; for graphite, between 0.1 and 3 mm. Suitable graphite foils are available in various types and thicknesses under the trade name SIGRAFIEX,® for example. The surface of the foil that faces the melt can be additionally coated therein through gilding, anodizing or another surface coating process, for example.

In the multi-shelled melt container the bearing shell can also be composed of a plurality of parts, e.g. of appropriately shaped segments. It is thus possible to construct complicated spatial shapes in simple fashion by means of standard preformed parts into which an inner shell—e.g. constructed as a foil—can be fitted. If the melt container is utilized to crystallize out the melt in the melt container or lying adjacent at its walls, then arbitrarily shaped monocrystals or polycrystalline bodies can be correspondingly obtained in simple fashion. In a multipart bearing shell, defective parts can be simply replaced, circumstances permitting.

It is also possible in a development of the invention to model the bearing shell from a bulk fill of loose, finely grained material. Suitable materials are silica sand, clays, $Al_2O_3$—or $ZrO_2$ powder with grain sizes between 0.1 $\mu m$ and 5 mm or mixtures of different materials. For better moldability a binding agent can be added to the loose material, such as glue, water glass, polyvinyl alcohol in aqueous solution, or others. A mold is modeled in a bulk fill of the cited material that is then received by the inner shell in positive fashion. The bulk fill is received as supporting shell through a suitable construction, for example a shuttering. Through this development it is possible to make available crystallization containers at low costs for the production of crystalline bodies in specific shapes or sizes in low piece numbers.

In a development of the invention further functional components of the inventive device are integrated into the bearing shells, or respectively, in their parts. The bearing shell can thus comprise means for heating or cooling the melt container, means for detecting the temperature in the interior of the melt container, and means for thoroughly mixing a substance to be melted or crystallized out in the melt container, for example. One or more of these means can be simultaneously arranged in the bearing shell independently of one another. Precise process monitoring in the crystallization, or respectively, producing of the monocrystals is possible through integrated means for heating and/or cooling of the melt in connection with suitable temperature measuring devices. The quality of the produced monocrystals is to a large extent dependent on the set temperature profile, or respectively, its temporal modification. The more precisely such a temperature/time profile is adjusted, the higher the quality is of the monocrystal that can be produced and the lower the number is of built-in imperfections such as crystal dislocations or foreign atoms present in the melt or other impurities.

In an embodiment of the invention, in a multipart bearing shell (or one poured from loose material), an additional supporting shell is provided with which the individual parts of the bearing shell are held together. The supporting shell need not be a complete shell. Rather, one or more rings or a framing encompassing the individual parts of the bearing shell are adequate. Other constructions that guarantee the union of the individual parts are also appropriate, however.

With a thinner wall of the inner shell of the inventive melting device compared to known melt containers the danger also increases that forces which act on the inner shell and which can damage this shell are possible due to crystals adhering tightly to the inner shell together with various heat expansion coefficients. To reduce this danger, in a development of the invention, the inventive device comprises an additional collection vessel for a melt, or respectively, residual melt as well as means for transfusion of the melt from the inner shell into the collection vessel.

If the crystallization process in a melt is carried out sufficiently slowly, then the probability of the incorporation of a foreign atom or other impurity is lower than the incorporation probability for atoms or molecules of the substance itself. In this way impurities concentrate in the residual melt. Beyond a certain concentration it makes sense to discard the residual melt in order not to contaminate the crystals still growing. In known methods such as the Czochralski method, the finished crystal is pulled out of the melt to this end. The residual melt is subsequently allowed to solidify in the melting crucible, or respectively, in the crystallization vessel. With the invention it is now possible to remove the residual melt from the melt container, or respectively, from its inner shell in liquid form without additionally having to remove the crystal already constructed. In this way, the solidifying of the residual melt in the melt container is avoided, which leads to a damaging of the latter given overly strong adhesion to the container walls.

In a development of the invention, the collection vessel or vessels are arranged in a container which can be evacuated by means of a vacuum pump. The container interior is connected with the melt with a tube or some other hollow line, whereby one end terminates via the collection vessel—which is open above—and the other end via the bottom of the inner shell. In the evacuating of the container, a depression is created which draws off the melt via the tube and conducts it into the collection vessel or vessels.

An airtight valve is preferably arranged in the tube or between tube and container. This enables an initial evacuation of the container exclusively and a creation of a depression therein relative to the environment, or respectively, relative to the atmosphere via the melt container. The suction process for the melt begins only with the opening of this shut-off valve. It is therefore possible to disengage the vacuum pump prior to opening the valve. This has the advantage that potentially aggressive and corrosive vapors rising from the melt cannot reach into the vacuum pump. A complete pumping out of the residual melt is achieved in simple fashion if the collection vessel is arranged at a level beneath the bottom of the inner shell. According to the principle of communicating tubes the melt then flows into the collection vessel through its own hydrostatic pressure when it has filled the tube completely. The pump serves only to suction the melt into the tube. If the collection device is arranged at a higher level, the melt must be suctioned off entirely by the vacuum.

By pumping off the residual melt from the inner shell and filling up new, pure melt of the substance, it is possible to carry out a crystal growing process without intervening cooling or even replacement of the melt container, and even given intensely contaminated residual melt, and thus to grow a crystal whose volume exceeds that of the melt container.

In an embodiment, the present invention provides an apparatus for liquefying and crystallizing a melt at a melt temperature. The apparatus comprises a melt container comprising a bearing shell and an inner shell matably received in the bearing shell. The inner shell comprises a material that is inert relative to the melt. The bearing shell is mechanically stable at the melt temperature. The inner shell comprises a wall having a first thickness and the bearing shell comprises a wall having a second thickness. The second thickness is substantially greater than the first thickness.

In an embodiment, the inner shell and bearing shell are detachably connected to one another.

In an embodiment, the bearing shell is molded from loose bulk fill.

In an embodiment, the inner shell is unitary in structure and the bearing shell comprises a plurality of connected pieces or components.

In an embodiment, the inner shell comprises a material selected from the group consisting of graphite, precious metals, glass and mixtures thereof.

In an embodiment, the bearing shell further comprises a heating element, a cooling element, a thermostat or an agitator or any combination thereof.

In an embodiment, the apparatus further comprises a collection vessel in communication with the melt container. The collection vessel receives liquid melt transmitted from the melt container.

In an embodiment, a tube extends between the melt container and the collection vessel for transmitting melt from the melt container to the collection vessel.

In an embodiment, the tube is connected to a vacuum pump for pumping liquid melt from the melt container to the collection vessel.

In an embodiment, the present invention provides a method for producing large crystalline bodies through crystallization of a melt. The method comprises the steps of providing a multi-shelled melting vessel which comprises at least one mechanically stable bearing shell and an inert inner shell matably received therein, at least partially filling the inner shell with a melt, allowing at least part of the melt to solidify into a crystalline body in the inner shell while allowing at least part of the melt to remain in liquid form, and removing the liquid part of the melt from the melt container.

In an embodiment, the method of the present invention further comprises the step of continuously pulling the crystalline body from the melt container.

In an embodiment, the step of removing the liquid part of the melt from the melt container further comprises the steps of providing a collection vessel in communication with the melt container and pumping the liquid part of the melt from the melt container to the collection vessel.

In an embodiment, the method of the present invention further comprises the steps of removing the crystalline body from the melt container together with the inner shell and separating the crystalline body from the inner shell.

In an embodiment, the method of the present invention further comprises the steps of discarding the inner shell after the crystalline body has been separated from the inner shell.

Other objects and advantages of the invention will become apparent upon reading the following detailed description and appended claims, and upon reference to the accompanying drawings.

BRIEF DESCRIPTION OF THE DRAWINGS

The invention is subsequently further detailed using an exemplifying embodiment as described in the drawings, wherein.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

Figure 1:
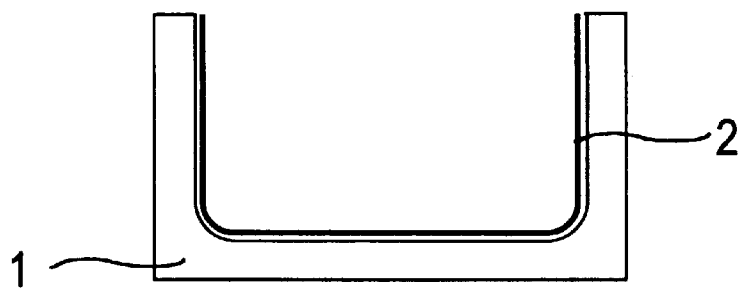
FIGS. 1 and 2 schematically illustrate a simplified cross-sectional view of melt containers made in accordance with the present invention.

FIG. 1 illustrates the simplest embodiment of the invention wherein a bearing shell 1 is provided that is open above in whose opening an inner shell 2 is fitted in positive fashion such that it resides with its outer surface practically entirely on the bearing shell 1. The cross section of the inner shell 2—shown in rectangular fashion in the figure—can also be constructed in semicircular or conical fashion and can be tapered downward in other embodiments of the invention. The ground surface of the inner shell 2 can also be round or rectangular or can comprise an arbitrarily different shape which is potentially fitted to the shape of the crystalline body of the substance grown from the melt. While the inner shell 2 consists of inert and thin material, and particularly of graphite foil, a ceramic material is preferred for the material of the bearing shell 1 due to the thermal and mechanical stability and the good moldability of ceramic materials.

Figure 2:
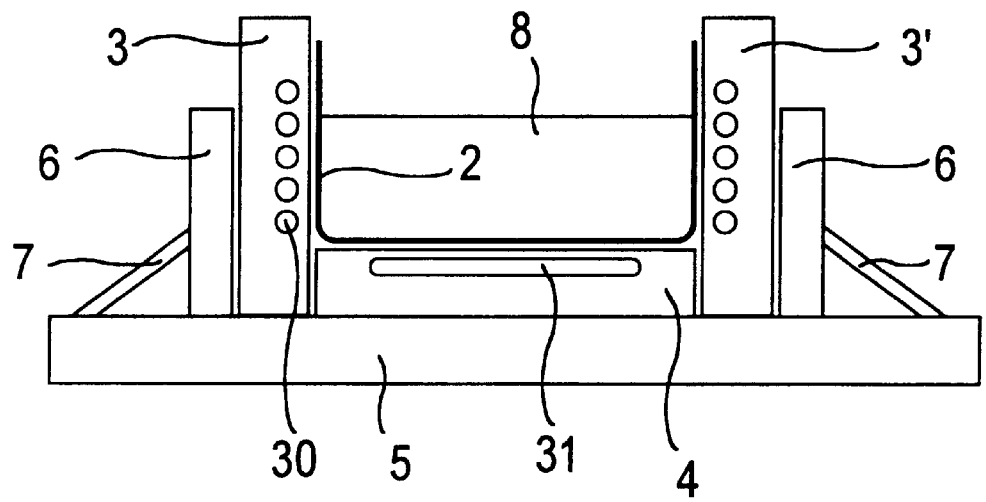

FIG. 2 depicts another development of the invention wherein the bearing shell is constructed of a plurality of assembled parts, of which only two sidewalls 3, 3' and a base plate 4 are depicted here in the figure. The melt container additionally comprises another outer shell which guarantees the union of the individual parts of the bearing shell. In the exemplifying embodiment shown in FIG. 2, the outer supporting shell consists of vertical parts 6, a base plate 5 and supporting struts 7.

Other functional elements 18, 19 are integrated into the individual parts 3, 4 of the bearing shell, particularly means for heating and/or cooling, temperature sensors as well as potentially means for thoroughly mixing the melt, for example agitators or sonic mixing devices. Due to the thin development of the inner shell 2 these functional elements are arranged at a close distance to the melt 8 located in the inner shell 2. An exact monitoring and controlling of the melting and crystallization process is thus achieved; in that, the temperature profile and its temporal modification can be precisely adjusted. The heating/cooling elements can preferably be controlled individually to this end.

Figure 3:
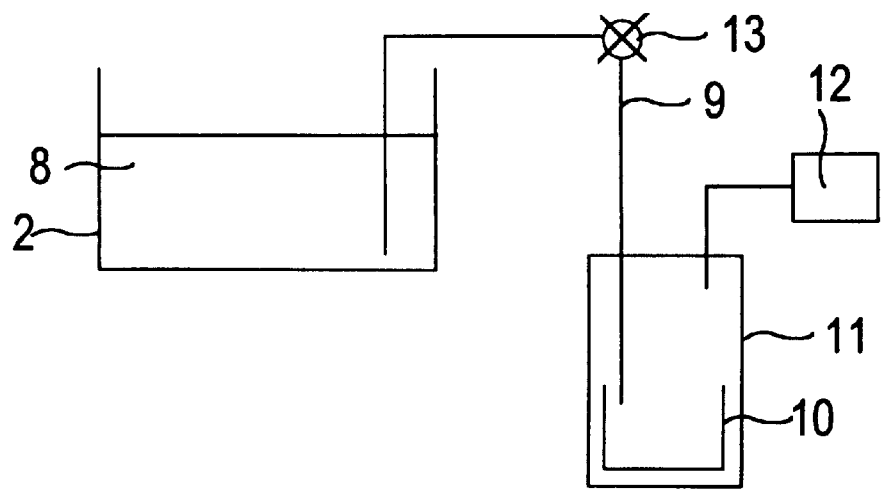
FIG. 3 illustrates, schematically, a device for melting and crystallizing made in accordance with the present invention.

FIG. 3 depicts the complete device for melting and crystallization. In order to avoid damage to the relatively thin inner shell 2 from the residual melt crystallizing out at the inner wall 2, means are provided for removing the residual melt from the inner shell 2. A tube 9 that is constructed here in a U shape serves to suction off the (residual) melt 8, the one end of the tube 9 reaches to the bottom of the inner shell 2 and the other end of which terminates via a collection vessel 10. The suction occurs via a vacuum pump 12 which evacuates a container 11 in which the collection vessel 10 is arranged. In the tube 9, a valve 13 is arranged in order to start, control, or stop the flow of the melt through the tube 9. Preferably, the part of the tube 9 that is submerged in the melt 8 in the inner shell 2 is produced from material that is heat-resistant and inert with respect to the melt 8. The rest of the tube 9 can consist of the same material or can also be prepared from a cost-effective material that comprises an inert coating only on the inside. The tube 9 is preferably thermally insulated and/or heatable in order to avoid a premature crystallization of the melt in the tube and thus an obstruction of the pumping out of the melt 8.

Other valves and gas filters can be attached between the vacuum pump 12 and container 11. The pump creates a depression in the container. As a result, the atmospheric pressure burdening the melt in the crucible pushes the melt through the tube until it flows into the collection vessel 10. The pump can run continuously during the entire transfusion of the melt. It is also possible, however, to first evacuate only the container 11 given a closed shut-off valve 13 and then to stop the pump or to close a valve that leads to the pump. The pressure differential between the two ends of the tube 9 is sufficient to push the melt 8 through the tube 9 into the collection vessel 10. The further transfusion can be guaranteed by a level difference between collection vessel 10 and the surface of the melt. In this embodiment the vacuum pump remains completely spared from potentially aggressive vapors rising from the melt so that the insertion of filters is not necessary.

Figure 4:
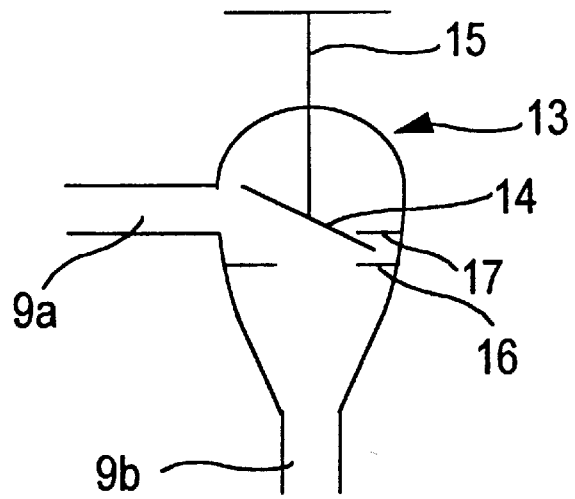
FIG. 4 illustrates, schematically, the shut-off valve shown in FIG. 3.

FIG. 4 shows a development of the shut-off valve as it can be integrated into the tube 9. The valve 13 consists of a hollow body, the part 9*a* of the tube leading to the melt container, and the subtube 9*b* leading to the collection vessel. A plate 14, on which a ring 16 can lie close by, serves to occlude. A spindle 15 guided into the valve from above serves for motion of the plate 14, or respectively, for actuation of the valve 13, it being possible to raise or lower the plate 14 with this spindle. As a result of a stopper 17, given the opening of the valve the plate 14 sets askew and thus creates in a short time an optimally large opening cross-section for the melt flowing through. Thus, the throughput cannot be blocked so rapidly by melt crystallizing there even given an unheated valve.

To prevent the moving parts of the valve 13 from being wetted by the melt and blocked upon solidification, they are preferably arranged so that they lie above the highest level of the melt flowing through and are protected against high-rising melt by a blowhole. To this end additional inert gas can be introduced into the hollow space of the valve 13 by appropriate devices. It is also possible to provide a leakage in the upper part of the valve 13 through which— given an open valve—air can be suctioned on the basis of the depression thereby prevailing in the hollow space of the valve 13, this air preventing a wetting of the moving part of the valve with melt flowing past. The volume of this inflowing air must be sufficiently large for this purpose but small compared to the volume of the container 11. It is also possible to release gas in the valve itself. To this end a substance can be introduced into the valve interior which releases a gas given heating, for example a water-saturated drying agent. If the melt reaches a critical height in flowing through the valve, steam (or another gas) is released from this substance until the melt can no longer rise due to the arising counterpressure.

Figure 5:
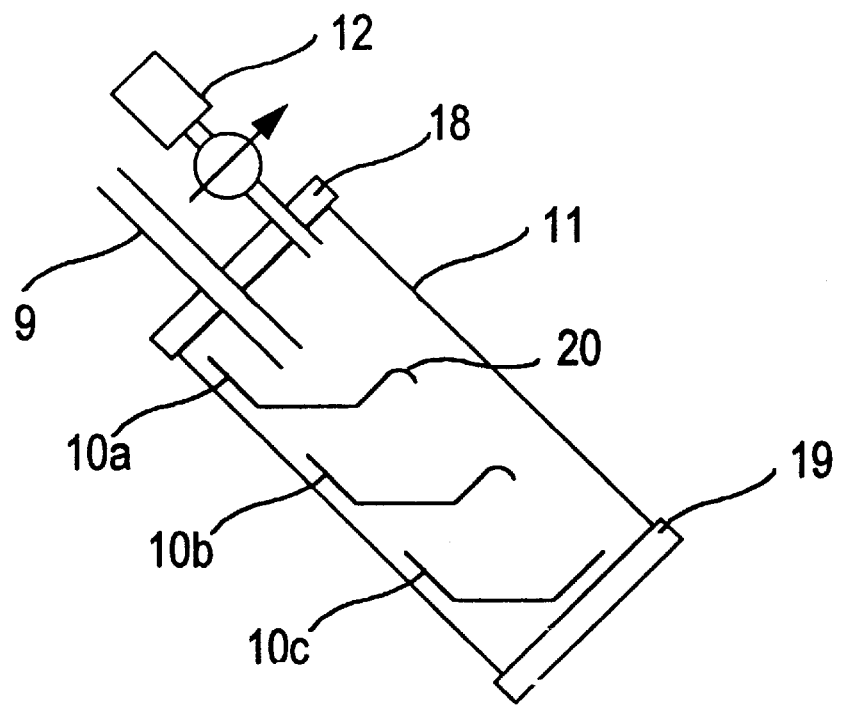
FIG. 5 illustrates, schematically, an alternative embodiment of the collection vessel, first shown in FIG. 3.

FIG. 5 illustrates a possible development of the container 11 and a possibility of the arrangement of a plurality of collection vessels 10*a*, 10*b* and 10*c*. The container 11—which can be evacuated—is preferably constructed as hollow cylinder which is sealed with two black flanges 18, 19 for example. Gas-tight through-lines are provided in the upper flange 18 for the tube 9 and the line leading to the vacuum pump 12. A plurality of collection vessels are arranged above each other within the container 11 in a cascaded, laterally displaced fashion. The transfused melt thus first fills the upper collection vessel 10*a* and can subsequently flow over the edge constructed as pouring margin 20 into the container 10*b* lying thereunder and from this, as soon as it is full, into the container 10*c* lying thereunder. This arrangement has the advantage that smaller manipulable collection vessels can be utilized. If the melt is to be utilized again, the collection vessels 10*a*, 10*b*, 10*c* consist of an inert and heat-resistant material. They are additionally designed such that the solidified melt is easily removed. This can be achieved in that the opening of each collection vessel expands upward. If on the other hand the residual melt is to be discarded, a material can be utilized for the collection vessel which is cost-effective and which needs to resist the heat and corrosion due to the melt for only a short period. To this end, the containers are placed on devices which conduct the heat rapidly away from the collection containers. The impact of this hot melt on the container is thereby temporally limited. It is possible in this way to collect melt of alkali halogenides such as NaI, CsI or KCl , for example, in aluminum vessels.

Referring back to FIG. 2, a framing 5, 6, 7 of special steel profile is erected for the supporting shell on the base plate of a hood type oven. The base plate 4 and eight like side elements 3 of the bearing shell are assembled in this framing. The side elements 3 are shaped such that in the assembled state they surround a cylindrical space of 600 mm in diameter and 150 mm deep. In all the side elements and the base element, resistance heating elements 18, 19 are integrated such that they are located close to the cylindrical space behind a 1 mm thick layer of electrically insulating $Al_2O_3$. The heating elements can be individually controlled. The temperature is measured with a respective thermoelement which is integrated into the respective element of the bearing shell such that it has direct contact to the inner shell.

The inner shell 2 is now carefully inserted into the space surrounded by the bearing shell. The inner shell consist of 0.1 mm thick platinum foil that is constructed as a cylinder 600 mm in diameter and 160 mm deep. For better handling, the cylinder comprises an edge which is 2 mm thicker at a width of 10 mm. For transport and for assembly the inner shell is pulled via a basket of solid plastic material which prevents a bruising or warping of the thin foil. The inner shell is inserted into the outer shell along with the basket. When the inner shell sits positively in the outer shell, the basket is withdrawn.

The multi-shelled crucible that has been produced in the manner described above is now filled with the material (CsI) to be melted, or respectively, crystallized. To avoid damaging the thin foil, lumpy raw material may not under any circumstances be brought into contact with the inner shell. Rather, the raw material (CsI) is first introduced in powder form onto the bottom and along the walls; lumpy or pelletized raw material is poured in only further inside if desired. When the crucible is filled in the necessary way, the hood type oven is lowered with the pulling means, the nuclear crystal and the observation means. The oven is inundated with the necessary atmosphere ($N_2$) and heated. A crystal growing according to Czochralski is then performed in a known fashion.

When the growing crystal has reached the desired length it is raised up until it loses contact with the melt. Then the (CsI) melt is heated to about 20° over its solidification point. The hood of the oven is withdrawn with the crystal and placed onto another base for cooling. A suction device is simultaneously attached. The Pt tube 9 of the suction device is inserted into the still liquid melt to the bottom of the crucible, whereby a stop prevents the tube from being accidentally submerged too deeply, thus damaging the inner shell (see FIG.3 ). The vacuum pump 12 is now switched on and the container 11 with the collection vessels 10 is evacuated. The atmospheric pressure over the growing crucible pushes the melt through the platinum tube into the container with the collection vessels of steel into which the melt flows. For better residual emptying the growing crucible together with the assembly framing can be slightly tilted, in that the framing is slightly elevated at one side with a forklift, for example. When the melt is extensively removed, air is drawn into the tube and the pumping process ends on its own. The pump is switched off. The growing crucible is cooled and refilled. A new growing process can be started. The residual melt in the collection vessels is likewise cooled and discarded in that it is washed out of the containers.

The inventive device and the melting and crystallization processes that can be carried out therein are particularly suited to those melts which are aggressive, can attack melting crucibles or can damage them through strong adhesion of the crystalline body. Such melts are particularly saline melts such as the previously mentioned alkali halogenides. It is also possible to utilize the device for melting semiconductors and other substances to be crystallized. In simple fashion the invention proposes a device that is suitable for creating crystals with large diameters of over 60 cm, for example, in a cost-effective manner. In particular, crystals with large diameters can be created in cost-effective fashion using the device.

In the application of methods according to Bridgman, Stockbarger or Stöber vessels of nearly any shape can be utilized with the device and thus bodies can be crystallized in shapes oriented to utilization.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed:

1. An apparatus for liquefying and crystallizing a melt at a melt temperature, the apparatus comprising:
    a melt container comprising a bearing shell and an inner shell matably received in the bearing shell, the inner shell comprising a material that is inert relative to the melt, the bearing shell being mechanically stable at the melt temperature, the inner shell comprising a wall having first thickness ranging from about 0.05 to about 3 mm, the bearing shell comprising a wall having a second thickness, the second thickness being greater than the first thickness,
    the apparatus further comprising a collection vessel in communication with the melt container, the collection vessel for receiving melt transmitted from the melt container.

2. The apparatus of claim 1 wherein the inner shell and bearing shell are detachably connected to one another.

3. The apparatus of claim 1 wherein the bearing shell is molded from loose bulk fill.

4. The apparatus of claim 1 wherein the inner shell is unitary in structure and the bearing shell comprises a plurality of connected pieces.

5. The apparatus of claim 1 wherein the inner shell comprises a material selected from the group consisting of graphite, a precious metal, glass and mixtures thereof.

6. The apparatus of claim 1 wherein the bearing shell further comprises a heating element.

7. The apparatus of claim 1 wherein the bearing shell further comprises a cooling element.

8. The apparatus of claim 1 wherein the bearing shell further comprises a thermostat.

9. The apparatus of claim 1 wherein the bearing shell further comprises an agitator for mixing a substance to be liquefied or crystallized in the melt container.

10. The apparatus of claim 1 further comprising a tube extending between the melt container and the collection vessel for transmitting melt from the melt container to the collection vessel.

11. The apparatus of claim 10 wherein the tube is connected to a vacuum pump, the tube extending from a bottom of the melt container to the vacuum pump and from vacuum pump to an open top of the collection vessel.

12. An apparatus for liquefying and crystallizing a melt at a melt temperature, the apparatus comprising:
    a melt container comprising a bearing shell and an inner shell matably received in the bearing shell, the inner shell comprising a material selected from the group consisting of graphite, a precious metal, glass and mixtures thereof, the inner shell comprising a wall having first thickness ranging from about 0.05 to about 3 mm,
    the bearing shell being mechanically stable at the melt temperature, the bearing shell comprising a wall having a second thickness, the second thickness being greater than the first thickness,
    the melt container being in communication with a collection vessel for receiving melt transmitted from the melt container by way of a tube extending between the melt container and the collection vessel, the tube being connected to a vacuum pump, the tube extending from a bottom of the melt container to the vacuum pump and from vacuum pump to an open top of the collection vessel.

13. The apparatus of claim 12 wherein the inner shell and bearing shell are detachably connected to one another.

14. The apparatus of claim 12 wherein the bearing shell further comprises a heating element, a cooling element, a thermostat and an agitator.

* * * * *